United States Patent [19]
Taniguchi et al.

[11] Patent Number: 4,639,062
[45] Date of Patent: Jan. 27, 1987

[54] CIRCUIT BOARD CONNECTION

[75] Inventors: Koki Taniguchi, Osaka; Shigeri Yamaguchi; Keiji Nakayama, both of Nara, all of Japan

[73] Assignee: Sharp Kabushiki Kaisha, Osaka, Japan

[21] Appl. No.: 839,807

[22] Filed: Mar. 12, 1986

Related U.S. Application Data

[63] Continuation of Ser. No. 572,053, Jan. 19, 1984, abandoned.

[30] Foreign Application Priority Data

Jan. 25, 1983 [JP] Japan ................................. 58-11039

[51] Int. Cl.⁴ ............................................ H01R 11/00
[52] U.S. Cl. ............................. 339/59 M; 339/17 M; 339/DIG. 3
[58] Field of Search ........... 339/17 CF, 17 LC, 17 M, 339/17 LM, 59, 60, 61, DIG. 3

[56] References Cited

U.S. PATENT DOCUMENTS

| 4,129,351 | 12/1978 | Sugimoto et al. | 339/17 LM |
| 4,201,435 | 5/1980 | Nakamura et al. | 339/DIG. 3 |
| 4,408,814 | 10/1983 | Takashi et al. | 339/59 M |
| 4,439,000 | 3/1984 | Kaufman et al. | 339/17 LM |
| 4,449,774 | 5/1984 | Takashi et al. | 339/59 M |
| 4,533,976 | 8/1985 | Suwa | 339/17 M |

Primary Examiner—Gil Weidenfeld
Assistant Examiner—Paula A. Austin
Attorney, Agent, or Firm—Birch, Stewart, Kolasch & Birch

[57] ABSTRACT

A method for connecting two circuit boards characterized in that by using rubber connectors, each having an open part for receiving circuit boards, an edge of a first circuit board requiring connection inserted into the open part of the rubber connector, followed by pressing a second rubber connector against the circuit board to complete connection of the two circuit boards.

3 Claims, 6 Drawing Figures

FIG. 1
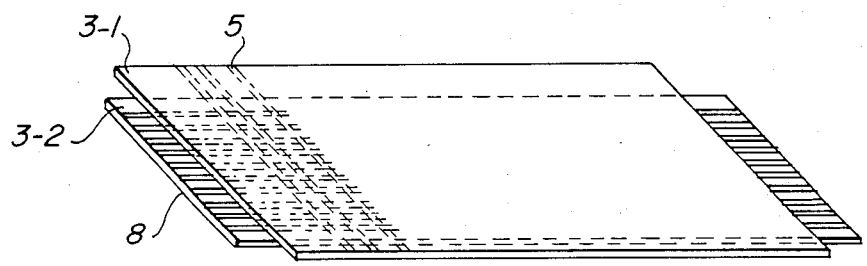
FIG. 2
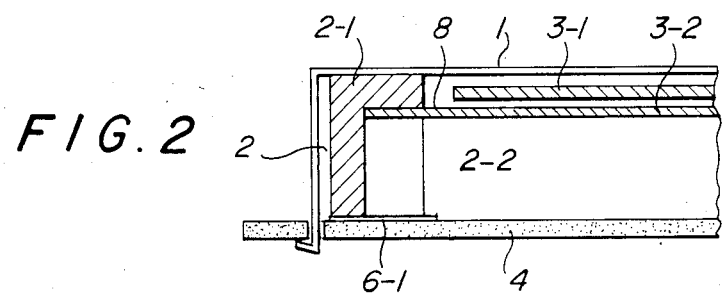
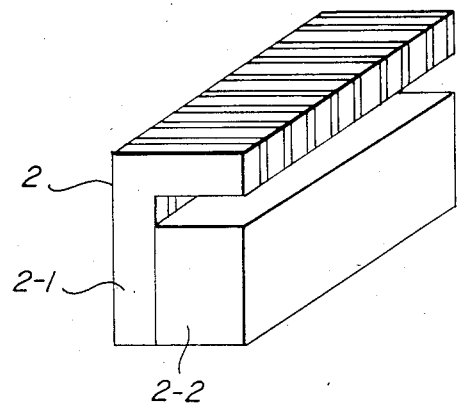
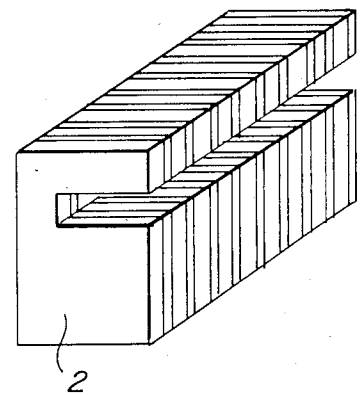
FIG. 3    FIG. 4

CIRCUIT BOARD CONNECTION

This application is a continuation of application Ser. No. 572,053, filed on Jan. 19, 1984, now abandoned.

BACKGROUND OF THE INVENTION

The present invention relates to a method for connecting two pieces of circuits boards.

Reflecting on today's need for a finer composition and a greater area for a variety of display segments including LCD, there are growing demands for realizing convenient and economic means for connecting circuit boards in order to improve the performance reliability of circuit boards against shock and vibration.

The present invention has been developed in order that such demands can be substantially satisfied. It aims at providing a convenient and economic method for connecting circuit boards having an extremely high performance reliability against shock and vibration.

OBJECT AND SUMMARY OF THE INVENTION

The present invention provides a method for connecting two pieces of circuit boards by using rubber connectors, each being provided with a circuit-board insertion part in which an edge of a circuit board requiring connection is inserted, followed by a procedure for pressing the rubber connector against the other circuit board via an angle to complete connection of the two circuit boards.

BRIEF DESCRIPTION OF THE DRAWINGS

FIG. 1 is a perspective view showing a circuit board connection device as a preferred embodiment of the present invention;

FIG. 2 is a sectional view showing a state of connection in the common side;

FIGS. 3 and 4 respectively show perspective views of a rubber connector in the common side;

DETAILED DESCRIPTION OF THE INVENTION

A preferred embodiment of the present invention relate to a method for connecting an LCD glass circuit board and a printed wiring board is described below.

In particular, the following description refers to the use of high-density LCD. When connecting common signals to the segment-side glass via conventional means using either silver pain or indium for connecting only the segment terminal to a printed wiring board, since a considerable area is needed for transferring the common signal, effective area for the display segments is unavoidably reduced by a large part. To prevent this, both the common and segment sides should be independently connected to the printed wiring circuit without using means for transferring common signals.

Figure 6:
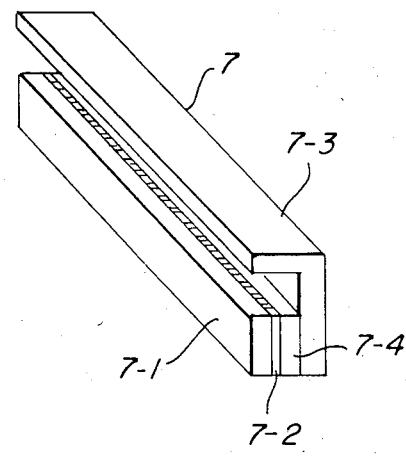
FIG. 6 is a perspective view of a rubber connector in the segment side.

The present invention primarily aims at eliminating such a disadvantageous problem by providing rubber connectors made of a configuration shown in FIGS. 3 and 6 in both the common and segment sides.

FIG. 1 is a perspective view showing a state in which both the common-side glass 3-2 and segment-side glass 3-1 of the LCD segments independently have connection terminals 8 and 5 in each side. Terminals of the common and segment sides may be drawn outside in 3 directions. FIG. 2 shows a sectional view of a state of connection in the common-side. Angle 1 brings a conductive film of the common-side glass 3-2 into contact with conductor 6-1 of the printed wiring board via a conductor layer of 2-1 of the rubber connector 2 of the common side.

Figure 5:
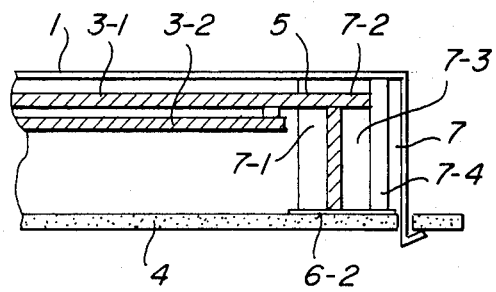
FIG. 5 is a sectional view of a state of connection in the segment side.

FIG. 3 shows a perspective view of the rubber connector 2 of the common side. The common-side rubber connector 2 is composed of part 2-1 that alternately contains conductive and insulated layers and also part 2-2 comprising only an insulator, which are combined together. A rubber connector of the common-side shown in FIG. 4 may also be used. However, if the rubber connector becomes smaller and such a rubber connector as shown in FIG. 4 is used, it will not only involve complex processing, but may also cause leakage to an adjacent conductor to occur due to presence of debris being generated during processing. By providing a configuration as shown in FIG. 3, the present invention simplifies such a process, allowing an economic and highly reliable connection to be achieved. FIG. 5 is a sectional view showing a state of connection in the segment side. Angle 1 brings a conductive film in the bottom surface of glass 3-1 of the segment side into contact with conductor 6-2 of the printed wiring board 4 via a conductor layer of 7-2 of the segment side rubber connector. FIG. 6 is a perspective view of a rubber connector 7 in the segment side. The segment-side rubber connector is composed of part 7-2 that alternately contains the conductive and insulated layers and also parts 7-1, 7-3, and 7-4 that respectively comprise only the insulated rubber, which are also combined together. Parts 7-3 and 7-4 may be integrated.

As is clear from the above description, since the display segments come into contact with an angle via the rubber connector, such a configuration not only effectively prevents shock and vibration that may otherwise cause damage to occur, but it also effectively prevents even the slightest deviation of the display segments from the printed wiring board. Such a configuration also eliminates fall or winding of rubber connectors themselves without being aided by a holder. In addition, since the angle, rubber connector, and display segments can be integrated into one unit easily, such an integrated unit can be easily and correctly installed into the position matching the printed wiring board, and as a result, an overall cost reduction can be achieved.

As described above, the method of connecting two units of circuit board embodied by the present invention features the use of rubber connectors each being provided with an open part receiving the circuit board for implementing the method by inserting one side of a circuit board into the open part of a rubber connector, followed by causing an angle to press the connector against the other circuit board to complete the required connection of the two circuit boards. The present invention provides a variety of advantages, typically as described below.

(1) Since modern display segments require a greater area and finer composition than before, size of rubber connectors should also be enlarged in length and become finer in the composition. In the embodiment of the present invention, since rubber connectors are installed by being inserted into the display segments, rubber connectors can be securely held without being aided by any special holder, while eliminating fall or winding of the rubber connectors themselves, thus resulting in the simplified process and easier assembly.

(2) Since display segments are brought into contact with an angle via part of the rubber connector, the display segments are extremely stable to any shock and vibration, in particular, such a reliable performance is quite noticeable when employing segments having a greater effective area and finer composition.

The present invention has been thus described in reference to an LCD. It should be noted, however, that the present invention not only includes the use of an LCD, but can also be applied to the connection of EL and printed wiring boards as well.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. An integrated display board connection assembly for a printed wiring board consisting essentially of:

display segments having both common and segment sides to be independently connected to a wiring circuit of said printed wiring board;

a rubber connector consisting of a part that alternately contains conductive and insulated layers and a part that is only an insulator combined together so as to form an elongated slot for the insertion therein of said display segments such that selective contact is made by said respective common and segment sides of said display segments with said wiring circuit of said printed wiring board; and an angle member interlocked with said printed wiring board, embracing and pressing said connector so as to bring a conductive film of said common side or said segment side respectively, of said display segment into contact with a corresponding conductor of said printed wiring board via a conductor layer of said rubber connector.

2. The display board connection assembly of claim 1, wherein said rubber connector is a common-side rubber connector.

3. The display panel connection assembly of claim 1, wherein said rubber connector is a segment-side rubber connector.

* * * * *